(12) United States Patent  (10) Patent No.: US 8,810,290 B1
Cloutier et al.  (45) Date of Patent: Aug. 19, 2014

(54) FRACTIONAL PHASE LOCKED LOOP HAVING AN EXACT OUTPUT FREQUENCY AND PHASE AND METHOD OF USING THE SAME

(75) Inventors: Mark Cloutier, Gatineau (CA); Gord Allan, Ottawa (CA); Tudor Lipan, Ottawa (CA)

(73) Assignee: Hittite Microwave Corporation, Chelmsford, MA (US)

( * ) Notice: Subject to any disclaimer, the term of this patent is extended or adjusted under 35 U.S.C. 154(b) by 0 days.

(21) Appl. No.: 13/374,730

(22) Filed: Jan. 10, 2012

Related U.S. Application Data

(60) Provisional application No. 61/460,988, filed on Jan. 11, 2011.

(51) Int. Cl.
  *H03L 7/06* (2006.01)
(52) U.S. Cl.
  USPC .................. 327/156; 327/147; 327/158
(58) Field of Classification Search
  USPC ................................. 327/147, 156
  See application file for complete search history.

(56) References Cited

U.S. PATENT DOCUMENTS

| 1,990,428 A | 2/1935 | De Regnauld de Belle-scize |
| 3,217,267 A | 11/1965 | Loposer |
| 3,353,104 A | 11/1967 | Loposer |
| 4,204,174 A | 5/1980 | King |
| 7,463,710 B2 | 12/2008 | Walsh et al. |
| 2011/0156782 A1* | 6/2011 | Huang et al. ............... 327/159 |
| 2011/0188551 A1* | 8/2011 | Shin et al. ................. 375/219 |

OTHER PUBLICATIONS

Riley et al., "Delta-Sigma Modulation in Fractional-N Frequency Synthesis", IEEE Journal of Solid-State Circuits, vol. 28, No. 5, May 1993, pp. 553-559.

Riley et al., "A Simplified Continuous Phase Modulator Technique", IEEE Trans. on Circuits and Systems-II; Analog and Digital Proc., vol. 41, No. 5, May 1994, pp. 321-328.

* cited by examiner

*Primary Examiner* — Adam Houston
(74) *Attorney, Agent, or Firm* — Iandiorio Teska & Coleman, LLP

(57) ABSTRACT

A fractional-N frequency synthesizer having an exact output frequency and phase includes a phase locked loop including a phase detector responsive to a reference signal and a fractional divider. The phase locked loop has an output signal whose frequency is a fractional multiple of the input reference signal. The synthesizer also includes a modulator having a modulus for providing an output to the fractional divider, in which the modulus multiplied by the ratio of the frequency of the output signal to the frequency of the reference signal is a non-integer number.

25 Claims, 5 Drawing Sheets

FRACTIONAL PHASE LOCKED LOOP HAVING AN EXACT OUTPUT FREQUENCY AND PHASE AND METHOD OF USING THE SAME

RELATED APPLICATIONS

This application hereby claims the benefit of and priority to U.S. Provisional Application Ser. No. 61/460,988, filed on Jan. 11, 2011 under 35 U.S.C. §§119, 120, 363, 365, and 37 C.F.R. §1.55 and §1.78, which application is incorporated herein by reference.

FIELD OF THE INVENTION

The subject invention relates to a fractional Phase Locked Loop.

BACKGROUND OF THE INVENTION

A Phase Locked Loop (PLL) is used to control the phase an oscillator. The PLL was first disclosed in France in 1931, and subsequently in U.S. Pat. No. 1,990,428 to Henri de Bellescize which described controlling the phase of a local oscillator by comparing it to a reference incoming oscillator phase to produce an error signal proportional to the phase difference $\Delta\Psi$, and using a narrow, large time constant filter to apply the phase error signal to the local oscillator to be corrected. The '428 patent further observed that so long as the oscillators were close in frequency, the two oscillations automatically maintain a fixed phase relation or phase difference.

U.S. Pat. Nos. 3,217,267 and 3,353,104 to Loposer, circa 1965, introduced the concept of using a digitally controlled divider in the feedback path of the PLL. Loposer observed that the output of the variable frequency oscillator is divided down to the reference frequency and phase-lock is achieved at this lower frequency. This approach is advantageous because selective frequency multipliers are not achievable, while selective dividers are. That is to say, when frequencies are multiplied, there is obtained not one multiple of the input frequency as an output but rather all multiples. In other words Loposer's improvement over the prior art was to easily be able to control the ratio of the output frequency to the reference frequency to an integer. Loposer's Integer PLL readily provided selective division ratios in integer steps, while maintaining phase lock of the output.

U.S. Pat. No. 4,204,174 to King in 1978 further refined Loposer's Integer PLL by the inclusion of a PLL phase locked loop in which a variable frequency voltage-controlled oscillator feeds a phase comparator via an adjustable divider, in which the VCO frequency can be adjusted in smaller steps than the reference frequency.

The '174 patent also observed that in its Fractional N synthesizer, the phase detector controls the VCO frequency Fo accurately at the desired value and therefore, the output frequency Fo can be changed not only in steps each of which has a minimum value equal to the value of the reference frequency Fr, but also in much smaller increments—by making the instantaneous adjustments to the division factor, i.e. N.

Riley et al. discussed the use of a delta-sigma modulator in a fractional N synthesizer in the 1993 paper entitled "Delta-Sigma Modulation in Fractional N Frequency Synthesis," IEEE JSSC May 1993. This type of modulation improved the output noise spectra while maintaining the basic phase relationships between the reference and output signals.

Riley described the rational fractional division by N in different terms, where n is the integer part, $2^k$, the modulus, is the maximum value in the accumulator and K is the desired fractional part:

$$N=n+K/2^k \quad (1)$$

Riley also pointed out that the accumulator modulus need not be an even power of two, and that exact decimal values could be obtained if a more general modulus M were used $$N=n+K/M \quad (2)$$

In the paper entitled "A Simplified Continuous Phase Modulator Technique", IEEE JSSC May 1994, Riley et al. detailed the use of a Fractional N Synthesizer to control the phase of an output waveform and showed how a Fractional N synthesizer could be used to implement narrowband constant-envelope continuous-phase modulation. The continuous phase modulation using a Fractional N Synthesizer, demonstrated by Riley also included the case of a single phase step.

In summary, by 1994, it was understood that the output frequency of a fractional synthesizer, $\omega_o$, was given by:

$$\omega_o=N\omega_r=(n+K/M)\omega_r \quad (3)$$

Where N is a rational number, of the form N=n+K/M, $\omega_r$ is the reference frequency and $\omega_o$ is the phase locked output frequency. As time progresses, the output phase is given by the frequency time product plus the initial phase.

It was also understood that if the frequency varies with time then the phase at a given time is defined by the integral of the frequency time product plus the initial value. If K is a sequence that varies with time, we can represent the instantaneous division ratio as N(t) and then the phase at any point in time is given by $\theta(t)$:

$$\text{Phase}=\omega_o t+\theta i=N\omega_r t+\theta i=(n+K/M)\omega_r t+\theta i \quad (4)$$

$$\theta_o(t) = \int N(t)\omega_r\, dt + \theta i \quad (5)$$

It was also understood that the first accumulator in the delta-sigma modulator integrated the value of N(t), hence represented the instantaneous phase of the output, and that the initial value in the accumulator, or its "seed" value, represented the initial phase of the output oscillator $\theta_I$.

Stated in terms of the values in the accumulator, the initial output phase is given by initial value $N_i$ in the phase accumulator, scaled by $2\pi/M$ $$\theta_I=2\pi N_i/M \quad (6)$$

U.S. Pat. No. 7,463,710 to Walsh et al. relates to a synthesizer that can program the output phase of a VCO at $\omega_o$, when the output frequency is related to $\omega_r$ by the relationship below, where the modulus of the accumulator is M, an integer, related to the desired step size of the synthesizer.

$$\omega_o=n+K/M\omega_r \quad (7)$$

Since the phase of the output is dependent upon the initial value in the accumulator (referred to as an interpolator by the '710 patent), the phase in the future is given by (5) and hence if one wishes to return to the same phase at some time in the future, one needs to recall the product of time and frequency and the seed value.

The synthesizer of the '710 patent further requires that the output frequency be related to the modulus of the accumulator M, and that the time need only be remembered with an effective period of $2\pi M/\omega_r$. Hence, the reference and the VCO frequencies of the '710 synthesizer must be related by the modulus of the accumulator. The problem with this method is that the modulus of the frequency must be related to the desired frequency spacing between channels. Not only does this restrict the possible answers, it results in large spurious content in the fractional synthesizer output at the desired channel spacing.

BRIEF SUMMARY OF THE INVENTION

It is therefore an object of this invention to provide a fractional-N frequency synthesizer having an increased number of possible output frequencies at which the phase has an exact decimal relationship to the reference, unrelated to the modulus.

It is a further object of this invention to provide such a fractional-N frequency synthesizer that can, in certain embodiments, reduce the spurious content.

The subject invention, however, in other embodiments, need not achieve all these objectives and the claims hereof should not be limited to structures or methods capable of achieving these objectives.

The invention results from the realization that a fractional-N frequency synthesizer can have exact output frequency and phase in its output signal by including a modulator having a modulus, in which the modulus multiplied by the ratio of the frequency of the output signal to the frequency of the reference signal is a non-integer number.

In one embodiment, this invention features a fractional-N frequency synthesizer having an exact output frequency and phase, the synthesizer which includes a phase locked loop including a phase detector responsive to a reference signal and a fractional divider, said phase locked loop having an output signal whose input frequency is a fractional multiple of the input reference signal. It also includes a modulator having a modulus for providing an output to the fractional divider, in which the modulus multiplied by the ratio of the frequency of the output signal to the frequency of the reference signal is a non-integer number.

The modulator may be implemented by a look up table. The modulator may be a delta-sigma modulator having a phase accumulator. The delta-sigma modulator may be a higher order delta-sigma modulator having a plurality of accumulators including the phase accumulator. The synthesizer includes a greatest common divisor (GCD) counter or an equivalent clocked at an input reference signal or a submultiple thereof. An output of the GCD counter may be used to only reset the phase accumulator in the delta-sigma modulator to its initial seed value, thus setting the long-term phase to an exact predetermined value and achieving reduced spurious. An output of the GCD counter may be used to reset all the accumulators in the modulator and to reset the phase accumulator to the initial seed value, thus setting the longer-term phase to a predetermined value. The modulator may accumulate the fractional value based upon a power of two modulus such that the rate of phase accumulation in the modulator is near but not equal to the desired output phase. The GCD reset instant may be synchronized to the next nearest modulator clock edge. The original phase may be desired immediately after returning to a previous output frequency, and all output frequencies are related by the GCD interval, then the phase accumulator is loaded immediately with a new seed number calculated by multiplying the desired frequency by a reference counter, to provide a number modulo of a GCD value, scaled to the modulus of the binary accumulator, and added to the original seed value. The synthesizer may further include a synchronizer responsive to the GCD counter and a clock of the modulator for crossing the clock domains of the GCD counter and the modulator clock.

In another embodiment, the invention features a method for achieving exact output frequency and phase from a fractional-N frequency synthesizer, the method includes: providing a phase locked loop including a phase detector responsive to a reference signal and a fractional divider, said phase locked loop having an output signal whose frequency is a fractional multiple of the input reference signal. It provides a modulator having a modulus for providing an output to the fractional divider. It accumulates a fractional value based upon the modulus, in which the modulus multiplied by the ratio of the frequency of the output signal to the frequency of the reference signal is a non-integer number.

A rate of phase accumulation may be near but not equal to the desired output phase. The modulator may include a phase accumulator, the method further including resetting the phase accumulator to the initial seed value at rate equal to an integer number of reference periods. The method may further include resetting the higher order accumulators. The original phase may be desired immediately after returning to a previous output frequency, and all output frequencies are related by the GCD interval, and may further include: immediately loading the accumulator with a new seed number calculated by multiplying the desired frequency by a reference counter, to provide a number modulo of a GCD value, scaled to the modulus of the binary accumulator, and added to the original seed value, and optimally resetting or not resetting, the higher order accumulators. The method may further include resetting the higher order accumulators. The method may further include synchronizing the GCD counter and a clock of the modulator for crossing the clock domains of the GCD counter and the modulator clock.

In another embodiment, the invention features a fractional-N frequency synthesizer achieving exact output frequency and phase, the synthesizer which includes: a voltage controlled oscillator for providing an output signal. It also includes a fractional-N divider responsive to the voltage controlled oscillator and including a modulator having a modulus, in which the modulus multiplied by the ratio of the frequency of the output signal to the frequency of the reference signal is a non-integer number for reducing spurious content in the output signal. It includes a phase detector responsive to a reference signal and the fractional-N divider for providing a control signal representative of the phase difference between the reference signal and the divided output signal from the fractional-N divider. It includes a loop filter responsive to the phase detector for filtering the control signal to control the voltage controlled oscillator.

The modulator may include a higher order delta-sigma modulator having a plurality of accumulators including a phase accumulator. The synthesizer may further include a greatest common divisor (GCD) counter clocked at an input reference signal or a submultiple thereof for resetting the phase accumulator in the delta-sigma modulator to its initial seed value. The accumulator may accumulate the fractional value based upon a power of two modulus such that the rate of phase accumulation is near but not equal to the desired output phase. The GCD counter may also be replaced by a modulated equivalent circuit whose average reset instant is equal to the simple GCD counter, but whose instantaneous reset instant is modulated in time to reduce patterns and noise. Many types of modulations could be used such as barrel shifters, delta sigma modulators or other types.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
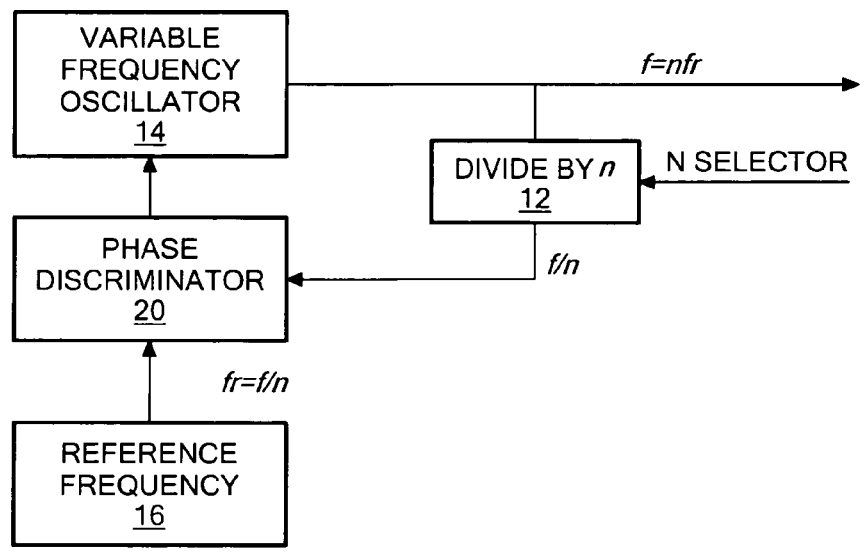
FIG. 1 is a schematic diagram of a prior art Integer Phase Locked Loop (PLL)

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

As described in the Background of the Invention above, prior art U.S. Pat. No. 3,353,104, FIG. 1, disclosed an Integer Phase Locked Loop (PLL) 10 which included a digital divider 12 in the feedback path. The output of a variable frequency oscillator 14 is divided down to the reference frequency 16 and a phase discriminator 20 achieves phase-lock at this lower frequency. This approach allowed the control of the ratio of the output frequency to the reference frequency, and provided selective division ratios in integer steps, while maintaining phase lock of the output.

Figure 2:
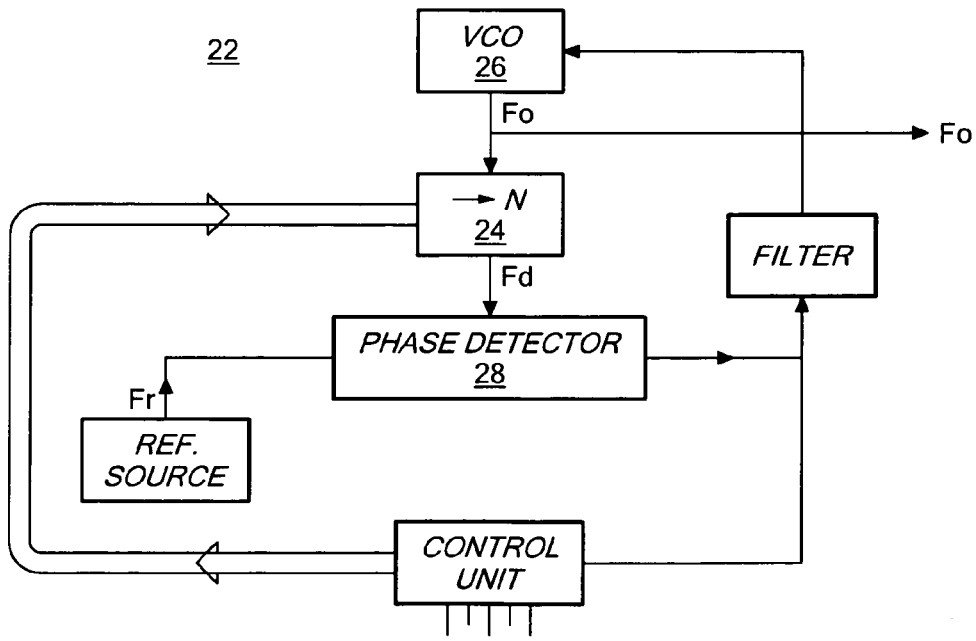
FIG. 2 is a schematic diagram of a prior art fractional N synthesizer.

Prior art U.S. Pat. No. 4,204,174, FIG. 2, disclosed a Fractional N synthesizer 22 that included an adjustable divider 24 in the phase locked loop, in which the output frequency of a variable frequency voltage-controlled oscillator (VCO) 26 can be adjusted in smaller steps than the reference frequency. In Fractional N synthesizer 22, a phase detector 28 controls the VCO frequency Fo accurately at the desired value and therefore, the output frequency Fo can be changed not only in steps each of which has a minimum value equal to the value of Fr (the reference frequency) but also in much smaller increments—by making the instantaneous adjustments to the division factor, i.e. N.

Figure 3:
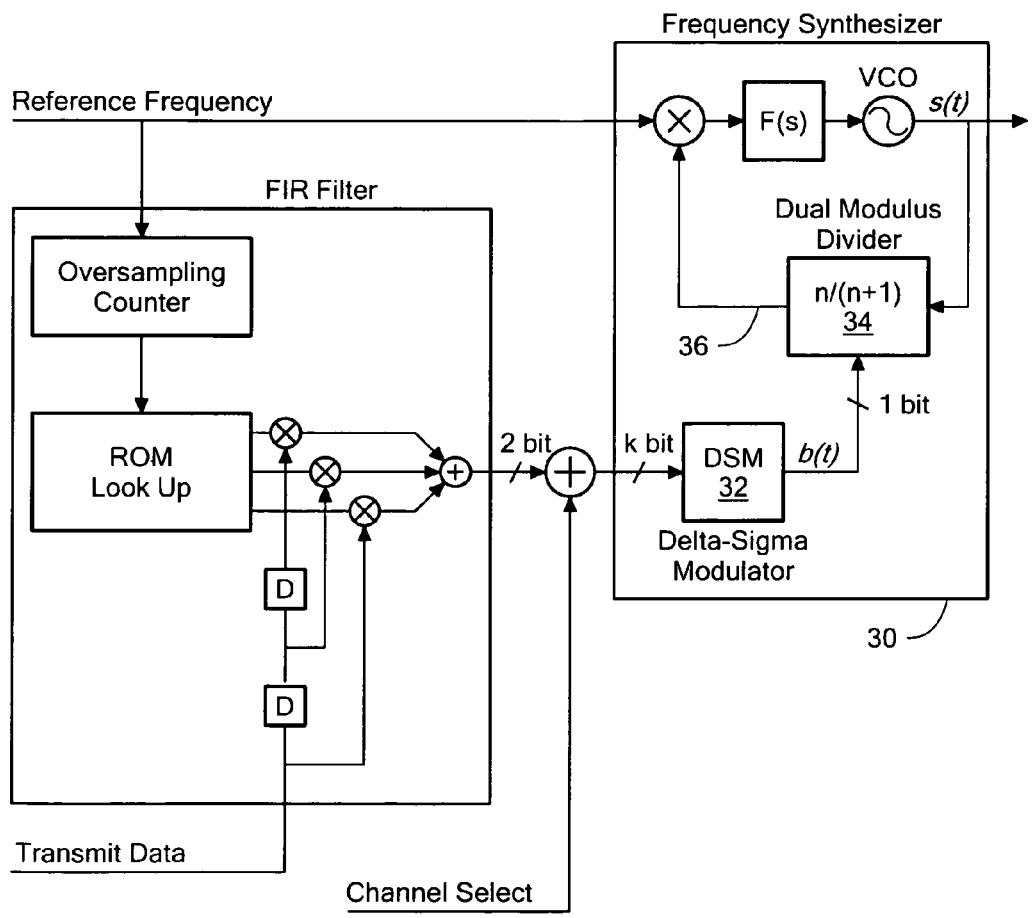
FIG. 3 is a is a schematic diagram of a prior art fractional N synthesizer with phase controlled output.

Prior art fractional N synthesizer 30, FIG. 3, disclosed by Riley et al. included a delta-sigma modulator 32 for controlling the divider 34 in the phase locked loop 36. This type of modulation improved the output noise spectra and allowed both static and modulated control of the basic phase relationships between the reference and output signals.

Also described in the Background of the Invention above is prior art U.S. Pat. No. 7,463,710 by Walsh 2008. The synthesizer of the '710 patent, however, requires that the output frequency be related to the modulus of the phase accumulator M. Hence, the reference and the VCO frequencies of the '710 synthesizer must be related by the modulus of the phase accumulator. If more than one frequency is required at a regular spacing, then a further disadvantage of the '710 synthesizer is that the modulus of the frequency must be related to the minimum desired frequency spacing between possible frequency outputs, or "channels". Not only does this restrict the possible modulus values, it results in large spurious content in the fractional synthesizer output offsets from all output frequencies at multiples of the desired channel spacing.

Figure 4:
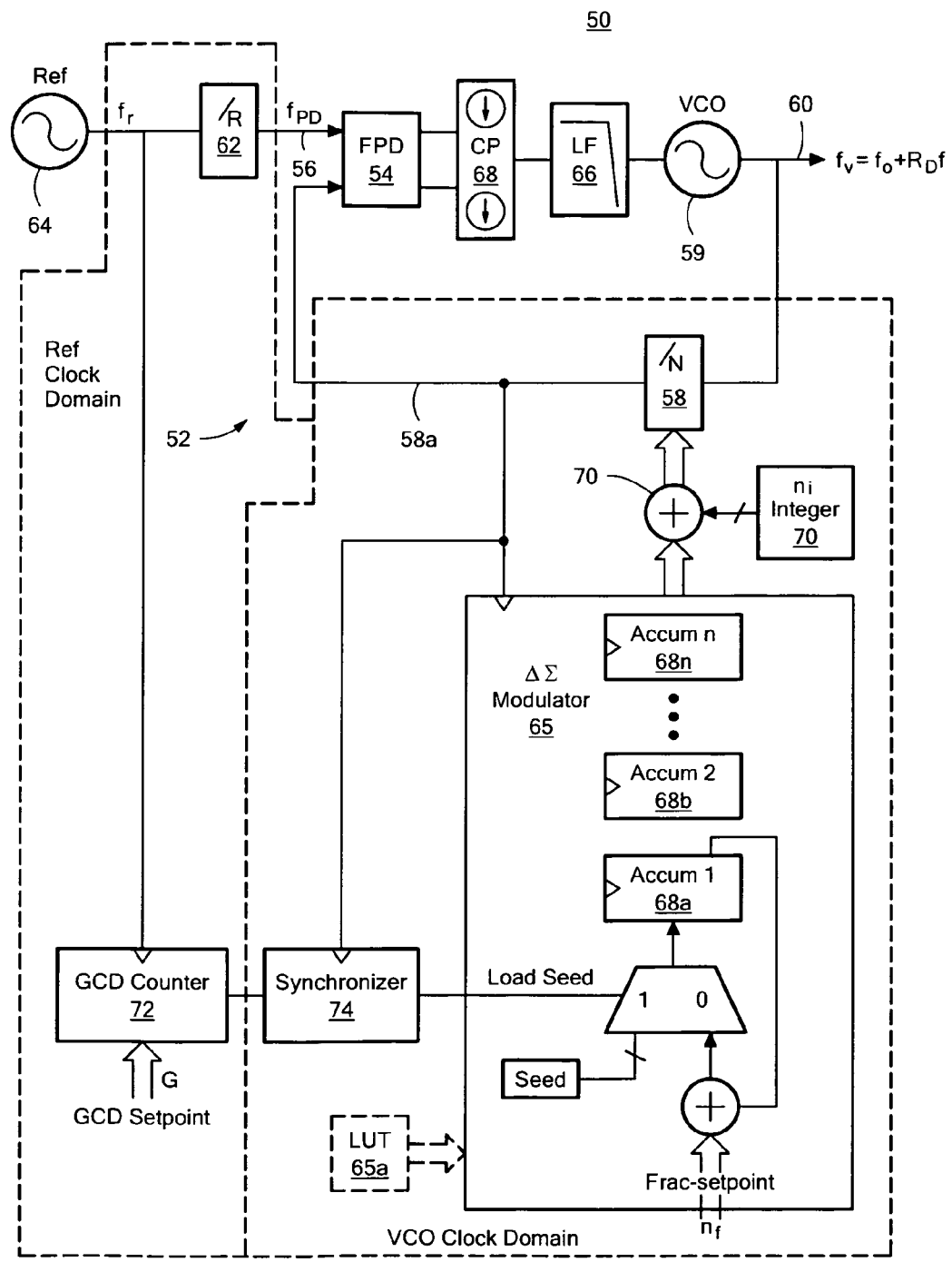
FIG. 4 is a fractional-N frequency synthesizer in accordance with an embodiment of the invention.

There is shown in FIG. 4 a Fractional N synthesizer 50 having reduced spurious content in accordance with an embodiment of the invention. Fractional-N frequency synthesizer 50 includes a phase locked loop 52 which includes a phase detector 54 responsive to a reference signal Fpd on line 56 and line 58a from fractional divider 58. Phase detector 54 provides a control signal representative of the phase difference between the reference signal Fpd and the divided output signal from the fractional-N divider. Phase locked loop 52 typically includes a voltage controlled oscillator 59 that provides an output signal Fo on line 60 whose frequency is a fractional multiple of the input reference signal on line 56. The input reference signal Fpd on line 56 may be provided from divider 62 in which case the signal is divided down from reference signal Fr provided by reference source 64. Fractional divider 58 is responsive to a modulator 65 having a modulus M. To reduce spurious content in the output signal, the modulus M is a large number, usually a power of two, selected in such a manner that when it is multiplied by the ratio of the frequency of the output signal Fo to the frequency of the reference signal Fpd, the result is a non-integer number. Using this approach allows the higher order accumulators to cycle at unrelated periods to the output frequency. This enables the output signal to be substantially devoid of any spurious content at multiples of the 1/M channel spacing that would otherwise occur if using the approach of the prior art '710 synthesizer described above.

In embodiments of the invention, Fractional-N frequency synthesizer 50 also includes a loop filter 66 responsive to phase detector 54 for filtering its output control signal to control the voltage controlled oscillator 59. Fractional-N frequency synthesizer 50 may also include a charge pump 68 for driving loop filter 66.

Modulator 65 is preferably a high order delta-sigma modulator having a plurality of accumulators 68a-68n in which the first accumulator 68a is known as the phase accumulator because it typically integrates the value of N, and hence represents the instantaneous phase of the output. Modulator 65, however, may also be implemented by a lower order delta-sigma modulator or even by a look-up table 65a shown in ghost-lines in FIG. 4. The output of modulator 65 is provided to divider 58 in addition to the integer part $n_i$ 70 which is added to the output of modulator 65 by adder 70.

Synthesizer 50 also includes a greatest common divisor (GCD) counter 72 which is clocked at the input reference signal Fr provided from input reference source 64. Alternatively, GCD counter 72 could be clocked at a sub-multiple of input reference signal Fr for resetting the phase accumulator 68a to its initial seed value. Synthesizer 50 further includes a synchronizer 74 that is responsive to GCD counter 72 and a clock 58a provided to modulator 65 for crossing the clock domains of the counter and the clock.

Figure 5A:
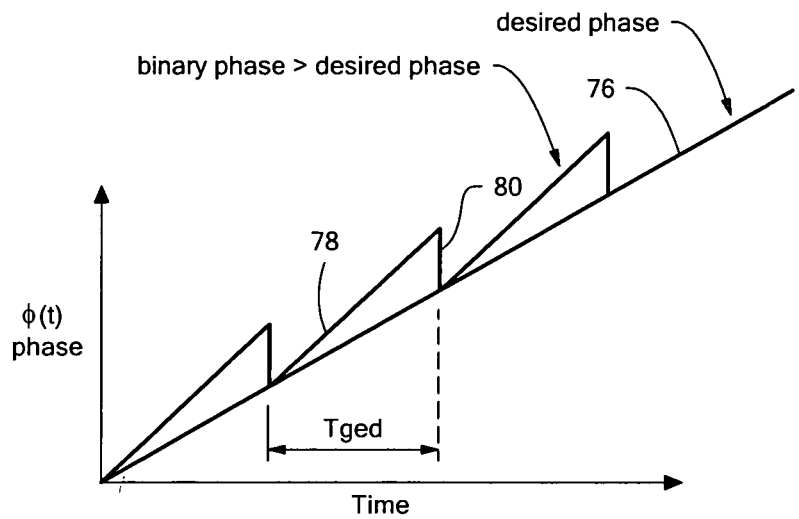
FIGS. 5a and 5b are graphs showing the possible phase accumulation implemented in the modulator of the fractional-N frequency synthesizer of FIG. 4.
Figure 5B:
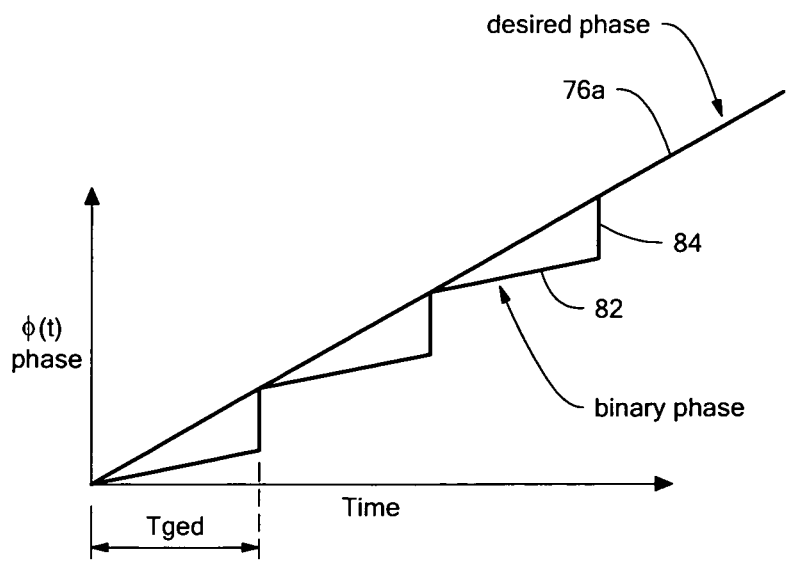

As shown in FIGS. 5A and 5B, modulator 65 accumulates the fractional value based upon a modulus of power of two such that the rate of phase accumulation is near but not equal to the desired output phase. For example, in FIG. 5A, the rate of phase accumulation in phase accumulator 68a, is greater than the desired output phase 76. Since the rate of phase accumulation is near but not equal to the desired output phase 76, the phase accumulator is typically reset to the initial seed value at a rate unrelated to the modulus and equal to an integer number of reference periods. Higher order accumulators are not reset. This can be seen at 78 where the accumulated phase is greater than the desired phase and the phase accumulator is reset at 80 to bring the phase closer to the desired phase 76. In FIG. 5A, the phase accumulator is reset at a rate dictated by the output of GCD counter 72.

Alternatively, the rate of phase accumulation can be less than the desired output phase 76a as shown in FIG. 5B. In this example, the accumulated phase 82 is less than desired output phase 76a and the phase accumulator is also reset at a time Tgcd dictated by the output of GCD counter 72.

Figure 6:
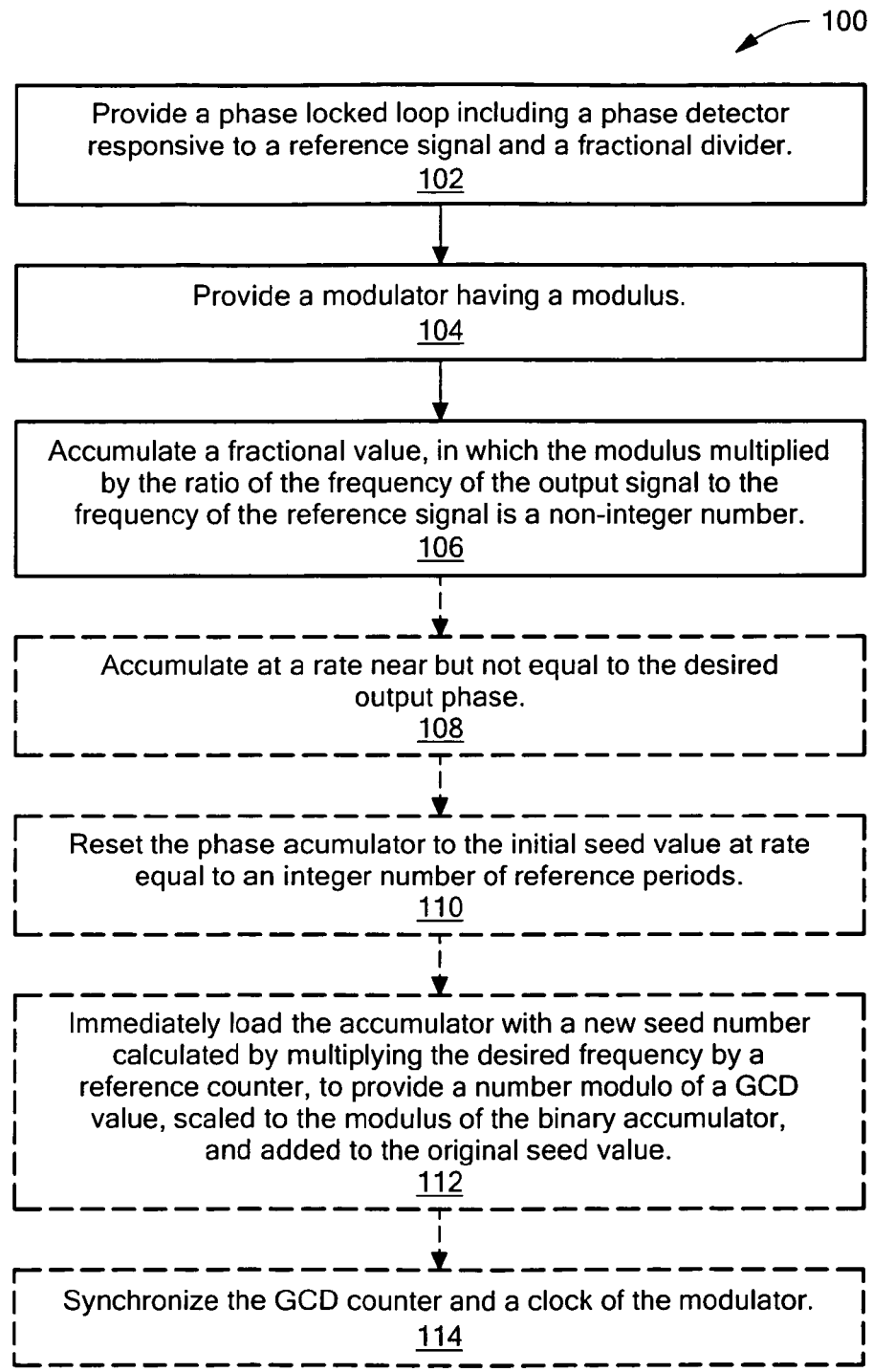
FIG. 6 is a flowchart for obtaining exact output frequency and phase in a fractional-N frequency synthesizer in accordance with another embodiment of the invention.

A flowchart 100 for a method for obtaining exact output frequency and phase from a fractional-N frequency synthesizer is shown in FIG. 6. The method begins at 102 with providing a phase locked loop including a phase detector responsive to a reference signal and a fractional divider. The phase locked loop has an output signal whose frequency is a fractional multiple of the input reference signal. At 104, a modulator is provided having a modulus for providing an output to the fractional divider. At 106, a fractional value based upon the modulus is accumulated, in which the modulus multiplied by the ratio of the frequency of the output signal to the frequency of the reference signal is a non-integer number for reducing spurious content in the output signal.

In an embodiment of the invention, this results in the step 108 in which the rate of phase accumulation is near but not equal to the desired output phase. The method may further include step 110 for resetting the phase accumulator to the initial seed value at rate equal to an integer number of reference periods.

If the original phase is desired immediately after returning to a previous output frequency, and all output frequencies are related by the GCD interval, then the method may further include step 112 of immediately loading the accumulator with a new seed number calculated by multiplying the desired frequency by a reference counter, to provide a number modulo of a GCD value, scaled to the modulus of the binary accumulator, and added to the original seed value.

Additionally, the method may include step 114 which includes synchronizing the GCD counter and a clock of the modulator for crossing the clock domains of the counter and the clock.

Generally, if a fractional synthesizer needs to maintain its phase at any time in the future, it should: 1) keep the reference clock running and coherent; 2) keep track of time; and 3) use the original start phase or seed value, 4) use an output frequency that is a multiple of the gcd frequency. Knowing these four basic variables is sufficient to return to the same phase (as if we had never left) at any arbitrary time in the future at a given output frequency.

As an example, suppose that it was desired to operate at exactly 2010 MHz with a 50 MHz reference, and suppose that we had a power of two fractional accumulator with M=2^24. The accumulator would be set to operate at a near frequency, $N_f$=round((10/50)*2^24), k/m*fpd=(Nf/M)$f_{pD}$=9,999,999.1. Here we are accumulating at a rate that is actually 0.1 Hz too slow.

Since the greatest common divisor of the fpd and fvco is 5, then in this example we need to reset the first accumulator every 5 reference cycles or every 100 nsec. The phase will have accumulated on average at −0.1 Hz for 100 nsec before being corrected. The resulting error in phase is −3.6 microdegrees, which is far below the phase noise and is negligible.

Although the above description describes resetting the accumulator seed at fixed integer multiples of reference cycles, this is not a limitation of the invention, and it is within the scope of the invention to reset the accumulator seed at a variable integer number of reference cycles, or at a constant number of cycles with small offsets in the accumulator seeds, as long as the average number of reference cycles between resets, or the average value of the seeds, remains constant.

Embodiments of the invention allow the long repeating pattern of the fractional modulator to be used, which has a short term high frequency error with a very slow repeating ΔΣ pattern, with a low average error, and uses a very low frequency collection at a periodic rate, while typically achieving zero frequency error on average. This results in much better spurious performance in the fractional synthesizer while allowing minute, linearly increasing errors, over short periods of time only, but keeping the longer term frequency and phase averages exact. Thus, the invention allows the fractional synthesizer to run with a fractional accumulation unrelated to the channel step size.

Although specific features of the invention are shown in some drawings and not in others, this is for convenience only, as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A fractional-N frequency synthesizer having an exact output frequency and phase, the synthesizer comprising:
    a phase locked loop including a phase detector responsive to a reference signal and a fractional divider, said phase locked loop having an output signal whose input frequency is a fractional multiple of the input reference signal; and
    a modulator having a modulus for providing an output to the fractional divider, in which the modulus multiplied by the ratio of the frequency of the output signal to the frequency of the reference signal is a non-integer number.

2. The synthesizer of claim 1 in which the modulator is implemented by a look up table.

3. The synthesizer of claim 1 in which the modulator is a delta-sigma modulator having a phase accumulator.

4. The synthesizer of claim 3 in which the delta-sigma modulator is a higher order delta-sigma modulator having a plurality of accumulators including the phase accumulator.

5. The synthesizer of claim 4 further including a greatest common divisor (GCD) counter clocked at an input reference signal or a submultiple thereof.

6. The synthesizer of claim 5, in which an output of the GCD counter is used to only reset the phase accumulator in the delta-sigma modulator to its initial seed value, thus setting the long-term phase to a predetermined value and achieving reduced spurious.

7. The synthesizer of claim 5, in which an output of the GCD counter is used to reset all the accumulators in the modulator and to reset the phase accumulator to the initial seed value, thus setting the longer-term phase to an exact predetermined value.

8. The synthesizer of claim 4 in which the modulator accumulates the fractional value based upon a power of two modulus such that the rate of phase accumulation in the modulator is near but not equal to the desired output phase.

9. The synthesizer of claim 5 in which the GCD reset instant is synchronized to the next nearest modulator clock edge.

10. The synthesizer of claim 5 in which if the original phase is desired immediately after returning to a previous output frequency, and all output frequencies are related by the GCD interval, then the phase accumulator is loaded immediately with a new seed number calculated by multiplying the desired frequency by a reference counter, to provide a number modulo of a GCD value, scaled to the modulus of the binary accumulator, and added to the original seed value.

11. The synthesizer of claim 3 further including a synchronizer responsive to the GCD counter and a clock of the modulator for crossing the clock domains of the gcd counter and the modulator clock.

12. A method for achieving exact output frequency and phase from a fractional-N frequency synthesizer, the method comprising:
providing a phase locked loop including a phase detector responsive to a reference signal and a fractional divider, said phase locked loop having an output signal whose frequency is a fractional multiple of the input reference signal;
providing a modulator having a modulus for providing an output to the fractional divider; and
accumulating a fractional value based upon the modulus, in which the modulus multiplied by the ratio of the frequency of the output signal to the frequency of the reference signal is a non-integer number.

13. The method of claim 12 in which a rate of phase accumulation is near but not equal to the desired output phase.

14. The method of claim 13 in which the modulator includes a phase accumulator, further including resetting the phase accumulator to the initial seed value at a rate equal to an integer number of reference periods.

15. The method of claim 14 in which the modulator includes higher order accumulators, further including resetting the higher order accumulators at a rate equal to an integer number of reference periods.

16. The method of claim 12 in which if the original phase is desired immediately after returning to a previous output frequency, and all output frequencies are related by a GCD interval, further including:
immediately loading the accumulator with a new seed number calculated by multiplying the desired frequency by a reference counter, to provide a number modulo of a GCD value, scaled to the modulus of the binary accumulator, and added to the original seed value.

17. The method of claim 16 further including resetting the higher order accumulators.

18. The method of claim 16 further including synchronizing the GCD counter and a clock of the modulator for crossing the clock domains of the GCD counter and the modulator clock.

19. A fractional-N frequency synthesizer achieving exact output frequency and phase, the synthesizer comprising:
a voltage controlled oscillator for providing an output signal;
a fractional-N divider responsive to the voltage controlled oscillator and including a modulator having a modulus, in which the modulus multiplied by the ratio of the frequency of the output signal to the frequency of the reference signal is a non-integer number for reducing spurious content in the output signal;
a phase detector responsive to a reference signal and the fractional-N divider for providing a control signal representative of the phase difference between the reference signal and the divided output signal from the fractional-N divider; and
a loop filter responsive to the phase detector for filtering the control signal to control the voltage controlled oscillator.

20. The synthesizer of claim 19 in which the modulator includes a higher order delta-sigma modulator having a plurality of accumulators including a phase accumulator.

21. The synthesizer of claim 20 further including a greatest common divisor (GCD) counter clocked at an input reference signal or a submultiple thereof for resetting the phase accumulator in the delta-sigma modulator to its initial seed value.

22. The synthesizer of claim 21 in which the accumulator accumulates the fractional value based upon a power of two modulus such that the rate of phase accumulation is near but not equal to the desired output phase.

23. A fractional-N frequency synthesizer having an exact output frequency and phase, the synthesizer comprising:
a phase locked loop including a phase detector responsive to a reference signal and a fractional divider, said phase locked loop having an output signal whose input frequency is a fractional multiple of the input reference signal;
a higher order delta-sigma modulator having a modulus for providing an output to the fractional divider, in which the modulus multiplied by the ratio of the frequency of the output signal to the frequency of the reference signal is a non-integer number;
said higher order delta-sigma modulator including a plurality of accumulators including a phase accumulator; and
a greatest common divisor (GCD) counter clocked at an input reference signal or a submultiple thereof.

24. A fractional-N frequency synthesizer having an exact output frequency and phase, the synthesizer comprising:
a phase locked loop including a phase detector responsive to a reference signal and a fractional divider, said phase locked loop having an output signal whose input frequency is a fractional multiple of the input reference signal;
a delta-sigma modulator having a phase accumulator and having a modulus for providing an output to the fractional divider, in which the modulus multiplied by the ratio of the frequency of the output signal to the frequency of the reference signal is a non-integer number; and
a synchronizer responsive to a GCD counter and a clock of the modulator for crossing the clock domains of the GCD counter and the modulator clock.

25. A fractional-N frequency synthesizer achieving exact output frequency and phase, the synthesizer comprising:

a voltage controlled oscillator for providing an output signal;

a fractional-N divider responsive to the voltage controlled oscillator and including a modulator having a modulus, in which the modulus multiplied by the ratio of the frequency of the output signal to the frequency of the reference signal is a non-integer number for reducing spurious content in the output signal;

a phase detector responsive to a reference signal and the fractional-N divider for providing a control signal representative of the phase difference between the reference signal and the divided output signal from the fractional-N divider;

a loop filter responsive to the phase detector for filtering the control signal to control the voltage controlled oscillator; and said modulator including a higher order delta-sigma modulator having a plurality of accumulators including a phase accumulator; and a greatest common divisor (GCD) counter clocked at an input reference signal or a submultiple thereof for resetting the phase accumulator in the delta-sigma modulator to its initial seed value.

\* \* \* \* \*